United States Patent [19]

Kakizaki et al.

[11] Patent Number: 5,088,922
[45] Date of Patent: Feb. 18, 1992

[54] HEAT-TREATMENT APPARATUS HAVING EXHAUST SYSTEM

[75] Inventors: Jyunichi Kakizaki, Fujisawa; Kenichi Yamaga, Sagamihara, both of Japan

[73] Assignee: Tokyo Electron Sagami Limited, Kanagawa, Japan

[21] Appl. No.: 644,565

[22] Filed: Jan. 23, 1991

[30] Foreign Application Priority Data

Jan. 23, 1990 [JP] Japan .................................. 2-13295
Feb. 5, 1990 [JP] Japan .................................. 2-25672
Jul. 4, 1990 [JP] Japan .................................. 2-177184

[51] Int. Cl.$^5$ .............................................. F27B 9/04
[52] U.S. Cl. ........................................ 432/152; 432/72
[58] Field of Search .............. 432/72, 74, 5, 6, 152, 432/253

[56] References Cited

U.S. PATENT DOCUMENTS

| | | | |
|---|---|---|---|
| 4,789,332 | 12/1988 | Ramsey et al. | 432/72 |
| 4,943,234 | 7/1990 | Sohlbrand | 432/152 |
| 4,992,044 | 2/1991 | Philipossian | 432/152 |

FOREIGN PATENT DOCUMENTS

| | | |
|---|---|---|
| 58-124226 | 7/1983 | Japan . |
| 61-160933 | 7/1986 | Japan . |
| 62-63421 | 3/1987 | Japan . |
| 63-238281 | 10/1988 | Japan . |
| 63-304620 | 12/1988 | Japan . |
| 259002 | 2/1990 | Japan . |

*Primary Examiner*—Henry C. Yuen
*Attorney, Agent, or Firm*—Oblon, Spivak, McClelland, Maier & Neustadt

[57] ABSTRACT

A heat-treatment apparatus of the invention includes a collective exhaust unit for constantly performing gas exhaust from a clean room to keep the room in a clean atmosphere, a heat-treatment furnace for receiving a gas and/or a liquid for forming a desired film on a surface of an object to be treated in a heating atmosphere, an exhaust path, communicating with the collective exhaust unit and the heat-treatment furnace, for introducing a gas filling the heat-treatment furnace into the collective exhaust unit, an outer air intake unit for taking in outer air in the exhaust path to adjust an exhaust pressure of the exhaust path, and a trap unit, arranged below the exhaust path, for trapping a waste liquid collected in the exhaust path.

12 Claims, 4 Drawing Sheets

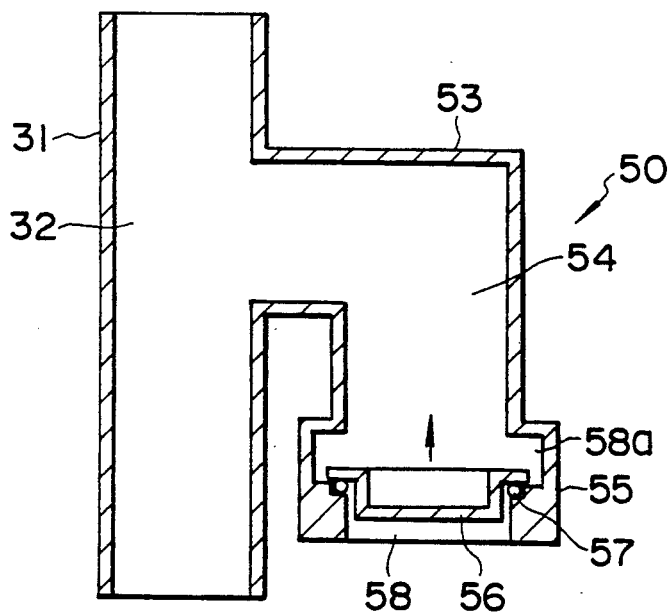
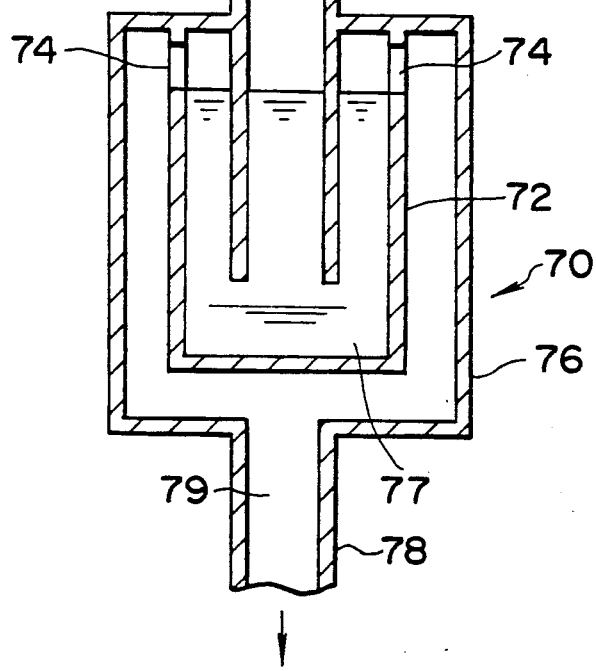
FIG. 4
FIG. 5

HEAT-TREATMENT APPARATUS HAVING EXHAUST SYSTEM

BACKGROUND OF THE INVENTION

1. Field of the Invention

The present invention relates to a heat-treatment apparatus for performing a heat treatment of semiconductor wafers and, more particularly, to an exhaust system for removing exhaust gases from a heat-treatment furnace.

2. Description of the Related Art

Recently, in the heat treatment process of manufacturing semiconductor devices, the size of a semiconductor wafer to be treated is increased from six inches (four inches) to eight inches, and the number of wafers to be subjected to batch processing in a heat-treatment furnace is also increased from 100 pieces to 150 pieces. For this reason, the type of a heat-treatment furnace to be used is shifted from a horizontal type to a vertical type, resulting in a great increase in furnace capacity.

In such a large, vertical type heat-treatment apparatus, since large amounts of exhaust gases are generated in oxidation and diffusion processes, an exhaust system is arranged to exhaust them out of the process system.

Published Unexamined Japanese Patent Application Nos. 62-63421, 63-238281, and 63-304620 respectively disclose exhaust systems having flow control valves. In these exhaust systems, an exhaust apparatus is complicated and expensive. In addition, a CVD apparatus, in which reaction products tend to adhere to the exhaust system, requires frequent maintenance and inspection.

Published Unexamined Japanese Patent Application No. 58-124226 discloses an exhaust system in which the pressure of exhaust gases from a process tube is kept constant in relation to a pressure corresponding to a liquid column. In this exhaust system, only when the internal pressure of an apparatus becomes larger than the atmospheric pressure, exhaust gases in the process tube are exhausted. In this system, however, if the internal pressure of the process tube becomes smaller than the atmospheric pressure, no exhaust gases are exhausted, and the flows of gases in the process tube become nonuniform. As a result, a film having a uniform thickness cannot be formed on a wafer surface.

As shown in FIG. 1, a collective exhaust apparatus 7 is generally installed in a semiconductor device manufacturing factory so as to perform an exhausting operation of the overall factory. This collective exhaust apparatus 7 includes a high-power fan 8. In addition, exhaust paths 5b of a plurality of heat-treatment apparatuses 2 (only one apparatus is shown in FIG. 1 but the other apparatuses 2 are omitted) merge into a path 5c of the collective exhaust apparatus 7. That is, the plurality of heat-treatment apparatuses 2 share the single exhaust system 7. Referring to FIG. 1, reference numeral 3 denotes a gas reservoir; 3a, a mass flow controller; 4, combustion apparatus (Steam generator); 5, a process tube; 5a, 5b, and 5c, gas pipes; and 6, a heater. Reference symbol B denotes a wafer boat; and W, a semiconductor wafer.

In such a collective exhaust apparatus 7, when all the heat-treatment apparatuses 2 in the factory are fully operated, exhaust gases in the process tubes 5 can be properly and uniformly exhausted. If, however, only some of the heat-treatment apparatuses are to be operated, the pressure in each process tube 5 is difficult to control to be a desired value. More specifically, the internal pressure of the exhaust path 5c of each heat-treatment apparatus 2 becomes an excessively large negative value, and the pressure in the process tube 5 tends to be smaller than that in a normal state. For this reason, the internal pressure of the process tube 5 does not reach a predetermined value, and a film having a desired thickness cannot be formed on a surface of a semiconductor wafer W.

In addition, in the collective exhaust apparatus 7, its exhaust power varies due to various factors such as voltage variations, and strong and weak exhaust flows are produced, resulting in so called pulsating flows. Pulsating flows in such a collective exhaust system disturb a gas flow in the process tube 5 and adversely affect the manufacture of semiconductor devices, such as variations in thickness of films formed on the wafers W.

Published Unexamined Japanese Patent Application No. 2-59002 discloses a trap unit for trapping reaction products contained in exhaust gases in a pipe of an exhaust system.

Published Unexamined Japanese Patent Application No. 61-160933 discloses a waste liquid processing system of a semiconductor substrate developing apparatus.

In the above-described exhaust system, however, an exhaust gas is cooled while it flows in the system, and a gas component whose temperature is lowered below a condensation temperature is condensed on a pipe wall. As a result, a waste liquid collects in the pipe.

In an apparatus used for a special treatment among vertical type heat-treatment apparatuses, since a waste liquid is produced in a pipe in large quantities which cannot be ignored, various problems are posed. Especially, in a technique of forming an oxide film by oxidizing a semiconductor wafer surface, since steam or humidified oxygen gas (wet $O_2$ gas) is used as a process gas, steam in the process gas is condensed on a pipe of the exhaust system, and a large amount of waste liquid is produced.

Of such apparatuses, especially in a steam oxidation apparatus, the amount of waste liquid is large, and a waste liquid tends to collect in a pipe of an exhaust system. If a large amount of waste liquid collects in the pipe, an exhaust path of an exhaust gas is narrowed by the waste liquid, and an exhaust gas in a process tube cannot be sufficiently exhausted. As a result, a gas flow in the process tube becomes nonuniform, and the thicknesses of films formed on semiconductor wafers subjected to batch processing vary. This impairs quality stability.

In another oxide film forming technique, in order to obtain a high-quality oxide film, a gas mixture obtained by mixing hydrochloric acid in a dry oxygen gas is sometimes used. In an exhaust system for exhausting such a gas, since stainless steel pipes tend to be corroded by hydrochloric acid, the inner surface of the pipe must be periodically cleaned. In cleaning, the pipes must be disassembled, and a time-consuming operation is required, resulting in a decrease in operating efficiency of a heat-treatment apparatus.

Furthermore, in order to remove adhesive contamination in a process tube, an HCl gas is introduced in the process tube while no semiconductor wafers are processed. If such a cleaning gas component is left in a stainless steel pipe of the exhaust system, the pipe is corroded and must be frequently replaced with a new one. This decreases the operating efficiency of the heat-treatment apparatus.

SUMMARY OF THE INVENTION

It is an object of the present invention to provide a heat-treatment apparatus having an exhaust system which can reduce variations in films formed on wafers to be subjected to batch processing even when variations (pulsating flows) occur in a factory collective exhaust apparatus or when only some of a plurality of heat-treatment apparatuses are operated (i.e., all apparatuses are not operated).

It is another object of the present invention to provide a heat-treatment apparatus having an exhaust system which is resistant to corrosion by an exhaust gas or a waste liquid and can endure long-term use.

In order to reduce the influences of variations of the above-described conventional collective exhaust apparatus upon each heat-treatment apparatus, the present inventor examined an arrangement wherein a branch pipe is arranged in an exhaust pipe of an exhaust system, and a pressure adjusting unit is provided in this branch pipe. An adjusting valve of this pressure adjusting unit is vertically arranged so that when the difference in pressure between the atmospheric pressure and the pressure in the exhaust pipe exceeds a predetermined value (the internal pressure of the exhaust pipe is decreased), the valve plug is pushed upward, and outer air flows into the exhaust pipe to automatically increase the internal pressure of the exhaust pipe.

In such an exhaust system, however, it is difficult to adjust the weight of the valve plug such that the valve is opened/closed in response to a small pressure difference (e.g., $-1$ mmH$_2$O) between the internal pressure of the exhaust pipe and the atmospheric pressure. In addition, if control of a factory exhaust system is disturbed and the internal pressure of a pipe of the exhaust system is greatly decreased as compared with a pressure in a normal operation, the valve is completely opened, and the internal pressure of the exhaust pipe cannot be held at a desired value. As a result, it is found that the pressure in the process tube fluctuates to cause variations in thickness of films formed on semiconductor wafer surfaces. The present invention has been made in consideration of such a situation.

According to an aspect of the present invention, a heat-treatment apparatus comprises collective exhaust means for performing gas exhaust from a room to keep the room in a clean atmosphere, heat-treatment vessel means for receiving a gas and/or a liquid for forming a desired film on a surface of an object to be treated in a heating atmosphere, an exhaust path, communicating with the collective exhaust means and the heat-treatment vessel means, for introducing a gas filling the heat-treatment vessel means into the collective exhaust means, outer air intake means for taking in outer air in the exhaust path to adjust an exhaust pressure of the exhaust path, and trap means, arranged at downstream of the exhaust path, for trapping a waste liquid collected in the exhaust path.

As the outer air intake means, an air intake unit may be employed which includes a switching valve designed to be automatically opened when a difference is caused between pressures inside and outside the exhaust system.

By providing such outer air intake means in the respective exhaust paths, an excessive difference between pressures inside and outside the exhaust system can be automatically canceled. Note that the outer air intake means may be arranged in a vertical exhaust path or a horizontal path of the collective exhaust means.

In addition, a lower exhaust unit may be arranged to exhaust a gas to the side of the trap means. The exhaust power of such a lower exhaust unit is preferably weaker than that of the upper collective exhaust unit so as to prevent an exhaust gas from being drawn downward during a normal operation and to prevent an unpleasant order from flowing upward from the trap unit when the upper collective exhaust unit is stopped.

Note that the exhaust path, the outer air intake unit, and the trap unit are preferably composed of ethylene fluoride resins depending on temperatures at which they are used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a sectional view showing an air intake unit for taking in air into a pipe of the exhaust system; and FIG. 5 is a sectional view showing a trap unit for trapping a waste liquid in the exhaust system.

DETAILED DESCRIPTION OF THE PREFERRED EMBODIMENT

An embodiment of the present invention will be described below with reference to the accompanying drawings.

Figure 1:
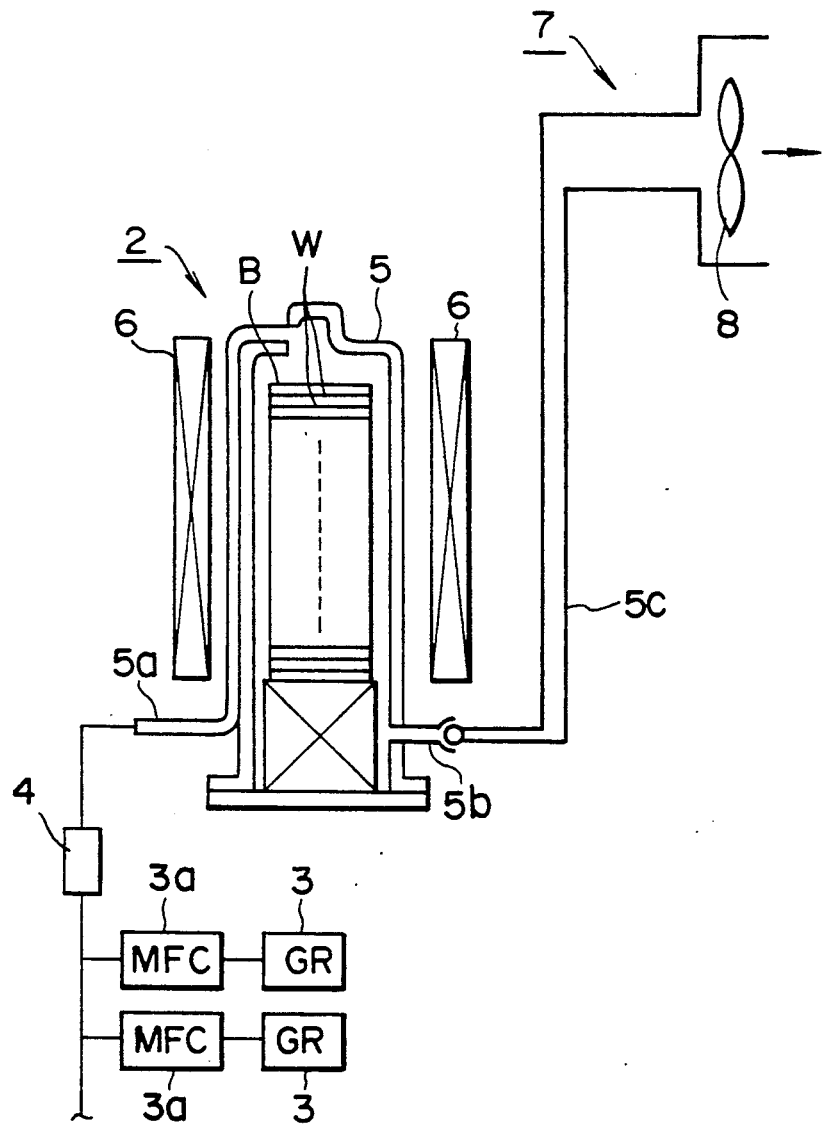
FIG. 1 is a schematic view showing an overall arrangement of a vertical type heat-treatment apparatus having a conventional exhaust system.
Figure 2:
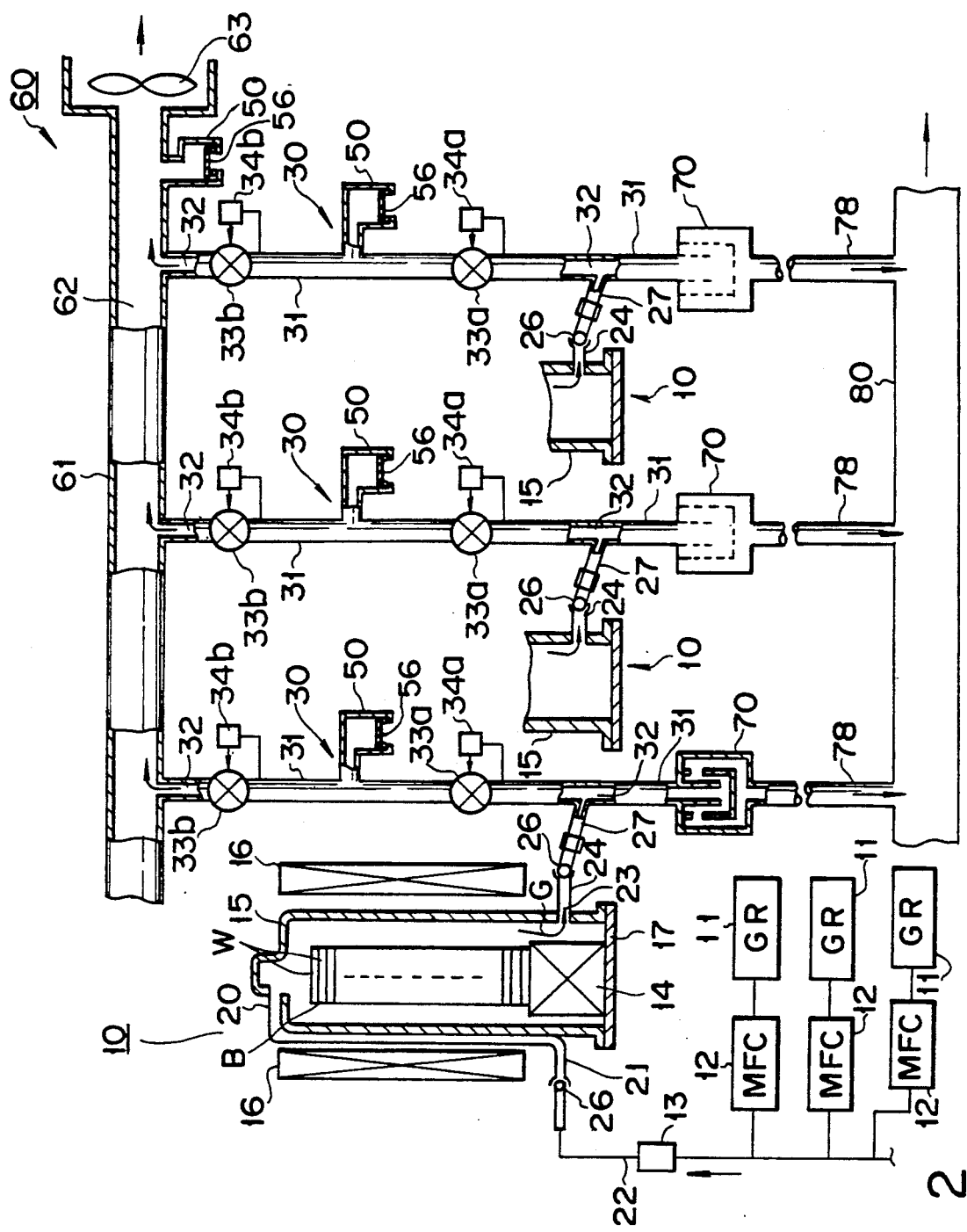
FIG. 2 is a schematic view showing an overall arrangement of a vertical type heat-treatment apparatus having an exhaust system according to an embodiment of the present invention.

As shown in FIG. 2, a plurality of vertical type heat-treatment furnaces 10 are arranged in a clean room equipped with an air conditioner (not shown), and a large number of silicon wafers W loaded in a boat B are subjected to batch processing in each heat-treatment furnace 10 at one time. Each heat-treatment furnace 10 is an automatic apparatus backed up by a computer system including a controller. All the operations of each heat-treatment furnace 10 are automatically controlled by the controller.

A process tube 15 in each heat-treatment furnace 10 has a vertical cylindrical shape and is fixed to a frame (not shown) by a support member (not shown). A heater 16 is wound around the process tube 15. A current to be supplied by a power source (not shown) for the heater 16 is properly controlled by a controller (not shown) of a computer system to set a desired temperature in the tube 15. Note that the heating capacity of the heater 16 is adjusted to set the temperature in the process tube within a temperature range of 800° to 1,200° C.

A cover member 17 is arranged at the lower opening of the process tube 15. A heat insulating cylinder 14 is mounted on the cover member 17. The vertical boat B is mounted on the heat insulating cylinder 14. The cove member 17 is supported by a support member (not shown). A nut of the support member is threadably engaged with a ball screw of an elevating mechanism (not shown).

A gas inlet port 20 is formed in an uppermost portion of the process tube 15. A gas exhaust port 23 is formed in a lower portion of the tube 15. The gas inlet port 20 communicates with a plurality of gas reservoirs (GR) 11 through pipes 21, 22 and combustion apparatus 13. Each gas reservoir 11 has a mass flow controller (MFC) 12 so that the amount of a gas to be fed into the process tube 15 can be controlled. The gas reservoirs 11 respectively store an oxygen gas, a hydrogen gas, a nitrogen gas, hydrochloric acid, and the like or solutions capable of being gasified.

The gas exhaust port 23 of the process tube 15 is constituted by a quartz tube 24, which is connected to a branch tube 27 of an exhaust system 30.

Figure 3:
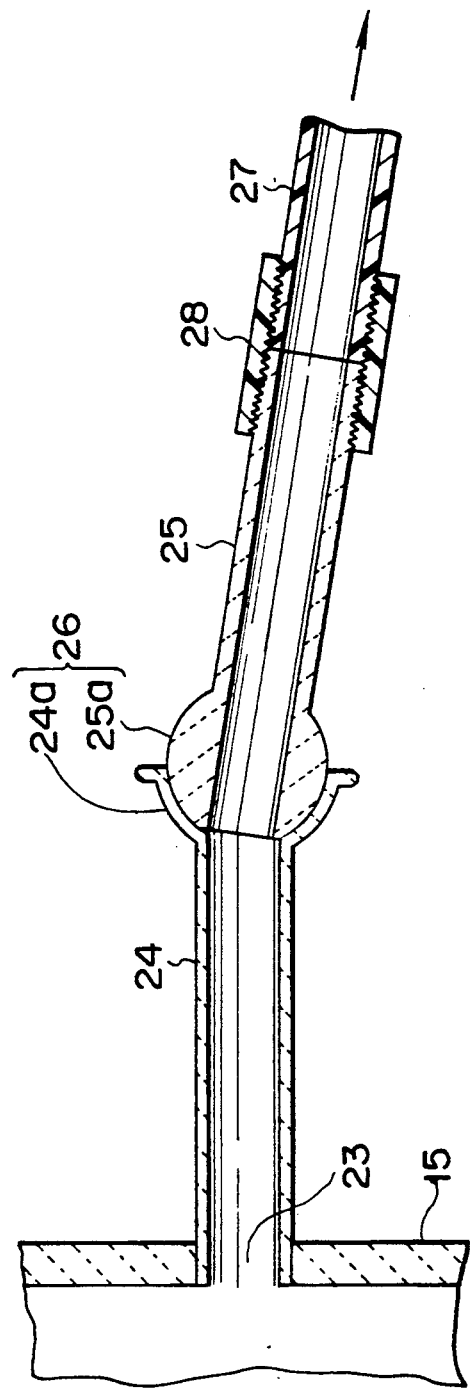
FIG. 3 is a sectional view showing a connecting pipe for connecting a heat-treatment furnace to the exhaust system.

As shown in FIG. 3, a distal end 24a of the quartz tube 24 has a hemispherical shape. A spherical end portion 25a of a short quartz tube 25 is slidably connected to the hemispherical end 24a. The short quartz tube 25 on the downstream side of this connecting portion is inclined downward at an angle of about 2° to 5°. The branch tube 27 and a nipple joint 28 consist of ethylene tetrafluoride.

As shown in FIG. 2, a collective exhaust unit 60 for exhausting gases from a factory is arranged on the ceiling. The collective exhaust unit 60 includes a common duct 61 and a large fan 63, and serves to exhaust contaminated air and exhaust gases from the room. A path 32 of a vertical pipe 31 of the exhaust system 30 of each heat-treatment furnace 10 communicates with a path 62 of the common duct 61. The large fan 63 is arranged at one end portion of the common duct 61 so as to discharge exhaust gases to the outside of the clean room through each path 32. Note that the common duct 61 is made of vinyl chloride resin and the like.

The gas exhaust tube 24 of the furnace 10 is connected to the vertical pipe 31 of the exhaust system 30 through the branch pipe 27. An air intake unit 50 is arranged at a proper portion, of the vertical pipe 31, above each branch pipe 27. A pair of pressure adjusting valves 33a and 33b are arranged in the flow path of each vertical pipe 31 so a to sandwich the air intake unit 50. Differential manometers 34a and 34b are respectively attached to the pressure adjusting valves 33a and 33b on the upstream and downstream sides. Note that an air intake unit 50 is also provided for the common duct 61.

A trap unit 70 is arranged at a portion, of the vertical pipe 31, below each branch pipe 27. Each trap unit 70 communicates with a collective pipe 80 through a corresponding lower pipe 78. The collective pipe 80 communicates with a tank (not shown) for waste liquid disposal. Weak exhaust of gases from the collective pipe 80 is performed by a blower (not shown) in an exhaust amount smaller than that of the upper collective exhaust unit.

The air intake unit 50 will be described below with FIG. 4.

An outer cylinder 53 of the air intake unit 50 laterally extends from the vertical pipe 31. A path 54 of the air intake unit 50 horizontally extends and is vertically bent downward. An opening 58 is formed in the lower end portion of the path 54. A stepped holding portion 58a is formed near the opening 58. The inner diameter of the holding portion 58a is larger than that of the path 54, and a peripheral portion of a float 56 rests on the upper step of the holding portion 58a. The float 56 is arranged to be substantially horizontal to close the opening 58 and to externally close the path 54 (to set the air intake unit 50 in a closed state) and to cause the path 54 to communicate with the outside (to set the air intake unit 50 in an open state).

An O-ring 57 is arranged on the lower step of the holding portion 58a. The O-ring 57 is brought into contact with the peripheral portion of the float 56 in a closed state of the air intake unit 50 so as to ensure airtightness The weight of the float 56 is determined to set a proper air intake amount. For example, if it is required that the difference between the atmospheric pressure and the pressure in the exhaust pipe path 32 becomes $-10$ mmH$_2$O, and if one atmospheric pressure corresponds to 10,000 mmH$_2$O ($=1$ kg/cm$^2$), the weight of the float 56 is set to correspond to 1 g/cm$^2$. Note that the respective components of the air intake unit 50 consist of an ethylene difluoride resin.

The trap unit 70 will be described below with reference to FIG. 5.

The trap unit 70 is arranged at a lower portion of each vertical exhaust pipe 31. More specifically, the trap unit 70 is arranged at a portion lower than a position at which the branch pipe 27 on the side of each process tube 15 merges a corresponding exhaust pipe 31. The trap unit 70 has a double casing structure consisting of inner and outer cylinders 72 and 76. The path 32 of each vertical exhaust pipe 31 communicates with the interior of a corresponding inner cylinder 72. A plurality of openings 74 are formed in an upper wall portion of the inner cylinder 72. The inner cylinder 72 communicates with the outer cylinder 76 through the openings 74. In addition, a waste liquid pipe 78 extends downward from a lower portion of the outer cylinder 76. A path 79 of each waste liquid pipe 78 communicates with the interior of a waste liquid tank (not shown) through the collective pipe 80.

Note that the material for each component of the trap unit 70 may be variously changed in accordance with a temperature. For example, a member used at a temperature of 140° C. or less consists of an ethylene difluoride resin (PVDF); a member used at a temperature of 140° to 260° C., an ethylene tetrafluoride resin (PTFE); and a member used at a temperature of 260° C. or more, quartz. In this case, since the outer cylinder 76 of each trap unit 70 is used at a temperature of 100° C. or less, transparent vinyl chloride resin may be used for it. A transparent ethylene fluoride resin may be used for the inner cylinder 72. Since the inner and outer cylinders 72 and 76 are constituted by transparent members, the amount of waste liquid can be visually checked from the outside.

A case will be described below, in which only one of the plurality of heat-treatment furnaces 10 is operated while the rest of the heat-treatment furnaces are stopped.

(I) Heat-treatment conditions are input beforehand in a CPU of a computer system through a keyboard. 150 silicon wafers W are mounted on the wafer boat B. The boat B is loaded in the process tube 15 of the first heat-treatment furnace 10 and is heat by the heater 16. At this time, a gas in the process tube 15 is replaced with an nitrogen gas in advance. The upper collective exhaust unit 60 is always operated, and hence the clean room is always subjected to an exhausting operation.

(II) When the uniform temperature area of the process tube 15 sets up e.g 1,000° C., an oxygen gas, a hydrogen gas, and a small amount of hydrochloric acid are respectively supplied from first, second, and third gas reservoirs 11 into combustion apparatus 13, steam ($H_2O$) generates by apparatus 13. The steam is introduced to the process tube 15 through the gas inlet port 20. The amount of each process gas component is adjusted by a corresponding MFC 12 to be desired value.

When the process gases flow among the silicon wafers W, the upper surface of each wafer W is oxidized to form an $SiO_2$ film.

(III) Since the exhaust system 30 is set at a negative pressure by the upper collective exhaust unit 60, exhaust gases after oxidation reaction and non-reaction process gas (exhaust gas G) are drawn into the exhaust system 30 through the lower exhaust port 23. The temperature of the exhaust gas G is about 200° to 400° C. at the exhaust port 23. While the exhaust gas G passes through the branch pipe 27 of the exhaust system 30, its heat is dissipated, and its temperature is decreased to liquefaction temperature of the gas G. The exhaust gas G flows from the branch pipe 27 into the vertical exhaust pipe 31 and collects in the path 62 of the upper collective pipe 61. In addition, the exhaust gas G is exhausted to the outside by the fan 63 through a filter (not shown).

(IV) Since the rest of the heat-treatment furnaces 10 are not operated, the amount of the exhaust gas G flowing in the path 62 of the upper collective pipe 61 is smaller than that of exhaust gas flowing when the plurality of the heat-treatment furnaces 10 are simultaneously operated. For this reason, the amount of the exhaust gas G flowing in the path 62 becomes smaller than the normal exhaust amount of the fan 63, and the internal pressure of the vertical exhaust pipe 31 is excessively decreased, thus increasing a differential pressure $\Delta P$ between the internal pressure and the atmospheric pressure. For example, when the differential pressure $\Delta P$ exceeds $-10$ mmH$_2$O, the floats 56 of the respective air intake units 50 are simultaneously raised to be separated from the O-rings 57, and air flows into the exhaust paths 32. As a result, the internal pressure of each vertical exhaust pipe 31 is increased, and the differential pressure $\Delta P$ becomes lower than $-10$ mmH$_2$O.

(V) When the exhaust amount of the collective exhaust unit 60 greatly varies due to irregular rotation, of the fan 63, caused by voltage variations or the like, pulsating flows may occur in the exhaust system. If pulsating flows occur in the exhaust system, the flow of a process gas (laminar flow) is disturbed. As a result a film may not be uniformly formed on the upper surface of each wafer W. However, if the differential pressure $\Delta P$ temporarily exceeds $-10$ mmH$_2$O due to pulsating flows, air is taken in from the air intake unit 50 into the exhaust system only during this period, thereby adjusting the internal pressure of the exhaust system to decrease the differential pressure $\Delta P$. When the differential pressure becomes lower than the $-10$ mmH$_2$O, the influences of the exhaust system upon the process system are suppressed.

(VI) In this manner, the interior of the exhaust pipe 31 is kept at about $-10$ mmH$_2$O instead of being set in an excessively negative state. At this time, the pressure adjusting valve 33a on the upstream side of the air intake unit 50 is adjusted to control the flow rate of the exhaust gas G such that a value detected by the differential manometer 34a falls within the range of $-1$ to 0 mmH$_2$O. In addition, the pressure adjusting valve 33b on the downstream side of the air intake unit 50 is adjusted while a differential pressure is detected by the differential manometer 34b in such a manner that the differential pressure between the internal pressure of the exhaust path 32 and the atmospheric pressure, in a state wherein the opening 58 is closed by the float 56, is kept to be a desired differential pressure $\Delta P$, e.g., within the range of $-15$ to $-20$ mmH$_2$O. Note that, in this case, feedback control may be performed to automatically drive the pressure adjusting valves 33a and 33b in accordance with outputs from the differential manometer and 34b.

By adjusting the pair of pressure adjusting valves 33a and 33b in the above-described manner, automatic pressure adjustment can be optimally performed by the air intake unit 50.

(VII) Meanwhile, exhaust gas components are partially condensed and liquified in the branch pipe 27. This waste liquid flows downward from the branch pipe 27 to the vertical pipe 31 and then flows from the vertical pipe 31 into the trap unit 70. When a waste liquid 77 collects in the inner cylinder 72 of the trap unit 70 and its liquid level is raised, the waste liquid 77 overflows from the opening 74. The overflowing waste liquid collects in the lower collective pipe 80 and is stored in the waste liquid tank (not shown).

(VIII) after the heat treatment, the exhaust gas G is caused to flow from the exhaust port 23 into the exhaust pipe 31. Since other heat-treatment furnaces 10 are not operated at this time, no exhaust gas G flows into them. Therefore, the ratio of the flow rate of the exhaust gas G to the exhaust power of the fan 21 is decreased.

Assume that the internal pressure of the exhaust pipe 31 is adjusted by only the float 56 of the air intake unit 50. In this case, even if a desired differential pressure between the internal pressure of the exhaust pipe 31 and the atmospheric pressure is $-1$ to 0 mmH$_2$O, the air intake unit 50 does not function until the negative pressure of the exhaust pipe 31 becomes very high.

For example, the negative pressure becomes $-10$ mmH$_2$O, the float 56 is pushed by the atmospheric pressure and is removed from the O-ring 57. As a result, outer air flows into the exhaust pipe 31 through the unit 50, and the excessive negative pressure of the path 32 of the exhaust pipe 31 is released. At this time, the pressure adjusting valve 33a arranged on the upstream side of the air intake unit 50 is adjusted to set the internal pressure of a portion on the upstream side of the pressure adjusting valve 33a to be $-1$ to 0 mmH$_2$O. The pressure adjusting valve 33b arranged on the downstream side of the air intake unit 50 is adjusted such that the differential manometer 34b always indicated $-10$ mmH$_2$O or lower, e.g., $-20$ mmH$_2$O, regardless of operating states of other heat-treatment furnaces 10.

According to the exhaust system 30 of the above-described embodiment, a variation in oxidation rate of the upper surface of a silicon wafer in each vertical heat-treatment apparatus can be suppressed to 2 to 3%. In a conventional exhaust system, a variation in oxidation rate of the upper surface of a silicon wafer corresponds to 5 to 10%. That is, according to the pre sent invention, such a variation can be reduced by 2 to 8%.

Therefore, the manufacturing yield can be greatly increased.

According to the exhaust system 30 of the above-described embodiment, since the trap unit 70 is provided in lower portion of the vertical exhaust pipe 31, even if the lower collective exhaust unit of pipe 80 is stopped, no unpleasant odor of the waste liquid flows upward to the upstream side of the trap unit 70. For this reason, reverse flows of the waste liquid and exhaust gas to the process system can be effectively prevented.

The effects of the present invention will be summarized below.

According to the exhaust system of the present invention, a variation in oxidation rate of the upper surface of a semiconductor wafer can be greatly reduced as compared with the prior art. For this reason, an oxide film having a desired thickness can be formed to reduce the fraction defective of semiconductor devices, thus greatly increasing the manufacturing yield.

The present invention is not limited to a heat-treatment such as an oxidation furnace or a diffusion furnace. The present invention can be applied to any heat-apparatus as long as it is arranged in a clean room a collective exhaust unit, e.g a heat-treatment for performing a heat treatment of semiconductor at a normal pressure such as a normal pressure CVD apparatus or a spin quarter apparatus.

In addition, the present invention is not limited to a type heat-treatment apparatus and can be applied to a horizontal type heat-treatment apparatus.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat-treatment apparatus arranged in a room in which a clean atmosphere is held, comprising:

collective exhaust means for performing gas exhaust the room to keep the room in a clean atmosphere;

heat-treatment vessel means for receiving a gas and-/or liquid for forming a desired film on a surface of an object to be treated in a heating atmosphere;

an exhaust path, communicating with said collective exhaust means and said heat-treatment vessel means, for introducing a gas filling said heat-treatment vessel means into said collective exhaust means; and outer air intake means including a float which is moved upward due to a difference in pressure between an internal pressure of said exhaust path and an atmospheric pressure, for taking in outer air in said exhaust path to adjust an exhaust pressure of said exhaust path.

2. An apparatus according to claim 1, further comprising trap means arranged downstream of said exhaust path for trapping a waste liquid collected in said exhaust path.

3. An apparatus according to claim 2, wherein said trap means includes another exhaust means for performing gas exhaust from a path on the downstream side of said trap means.

4. An apparatus according to claim 3, wherein exhaust power of said another exhaust means is lower than that of said collective exhaust means.

5. An apparatus according to claim 1, wherein said outer air intake means is arranged in a vertical portion of said exhaust path.

6. An apparatus according to claim 1, wherein said outer intake means is arranged in a horizontal portion of said exhaust path.

7. An apparatus according to claim 1, wherein at least part of a horizontal pipe constituting said exhaust path is gradually inclined downward from said heat-treatment vessel means.

8. An apparatus according to claim 2, wherein said trap means is arranged in a vertical portion of said exhaust path.

9. An apparatus according to claim 1, wherein a pipe constituting said exhaust path is composed of an ethylene fluoride resin.

10. An apparatus according to claim 1, wherein said exhaust path and said float of the air intake means are composed of an ethylene fluoride resin.

11. An apparatus according to claim 1, wherein a pipe constituting said exhaust pipe is composed of an ethylene fluoride resin.

12. An apparatus according to claim 1, wherein said heat-treatment vessel means includes a vertical type heat-treatment furnace.

* * * * *